United States Patent
Prabhakaran et al.

(10) Patent No.: US 7,619,502 B2
(45) Date of Patent: Nov. 17, 2009

(54) POTENTIOMETER SYSTEM AND METHOD

(75) Inventors: Joy P. Prabhakaran, Bangalore (IN);
Jyothi K. N. Setty, Bangalore (IN)

(73) Assignee: Honeywell International Inc.,
Morristown, NJ (US)

( * ) Notice: Subject to any disclaimer, the term of this patent is extended or adjusted under 35 U.S.C. 154(b) by 347 days.

(21) Appl. No.: 11/167,893

(22) Filed: Jun. 27, 2005

(65) Prior Publication Data

US 2006/0214763 A1    Sep. 28, 2006

(30) Foreign Application Priority Data

Mar. 22, 2005 (IN) .......................... 618/DEL/2005

(51) Int. Cl.
*H01C 3/20* (2006.01)

(52) U.S. Cl. .................. 338/302; 338/68; 338/118; 323/369; 323/297

(58) Field of Classification Search .............. 338/302, 338/68, 260, 118, 200; 323/369, 297, 298, 323/353, 354
See application file for complete search history.

(56) References Cited

U.S. PATENT DOCUMENTS

| 3,964,087 A | * | 6/1976 | Mallon ....................... 338/306 |
| 4,668,932 A | * | 5/1987 | Drori et al. .................... 338/48 |
| 5,389,872 A | * | 2/1995 | Erhart et al. ................. 323/354 |
| 5,923,159 A | * | 7/1999 | Ezell ........................... 323/354 |
| 6,331,768 B1 | | 12/2001 | Drori et al. |
| 6,555,996 B2 | | 4/2003 | Drori et al. |

OTHER PUBLICATIONS

"Dual 64-/256-Position I2C Nonvolatile Memory Digital Potentiometers", *Analog Devices Inc.—Preliminary Technical Data AD5251/AD5252*, (2004),27 pgs.

\* cited by examiner

*Primary Examiner*—Kyung Lee
(74) *Attorney, Agent, or Firm*—Schwegman, Lundberg, & Woessner P.A.

(57) ABSTRACT

A potentiometer network includes a first main terminal, a second main terminal, a plurality of resistive elements connected in parallel between the first main terminal and the second main terminal, and means for embedding calibration of said resistive elements in said potentiometer network.

13 Claims, 8 Drawing Sheets

POTENTIOMETER SYSTEM AND METHOD

CROSS REFERENCE TO RELATED APPLICATIONS

This application claims priority to India Patent Application No. 618/DEL/2005, filed Mar. 22, 2005, which is incorporated herein by reference.

BACKGROUND

Electronic circuits containing variable impedance elements are used in many applications. These variable impedance elements are usually in the form of variable resistors, also called potentiometers. Circuits using variable inductors or capacitors are also widely used. These variable impedance elements are usually manually adjusted to provide a selected impedance so as to affect some aspect of the circuit in which they are located. For example, a potentiometer may be set to a value which maximizes a signal generated at a node in a given circuit.

Manual adjustment of potentiometers is usually unsatisfactory in circuits under the control of data processing systems or other external electric circuits where ongoing adjustment of the potentiometer is necessary for circuit operation. The data processing system often must change the value of the variable impedance element in a time that is short relative to the time required to complete a manual adjustment of the variable impedance element. Manual adjustment also requires the presence of an operator. Operators are prone to error. Furthermore, in many situations manual adjustment is impractical. Remote control of resistance by a computer or digital system is needed in many applications.

A potentiometer can be controlled by mechanically adjusting motors or other actuators. Although these potentiometers relieve the need for an operator, they are still unsatisfactory in many applications. The time to make an adjustment is still too long for many applications. In addition, the long term reliability of such electromechanical devices is not sufficient for many applications requiring variable impedance elements. In addition, such systems are often too costly and consume too much real estate for many applications.

Digital potentiometers have been developed as a solution to the above problems. These digital potentiometers generally comprise a network of resistors that are selectively connected to a wiper terminal by a network of transistors, all of which are integrated onto a single chip of a semiconductor. Because fixed-values resistors are used and because the wiper position is selected by one or more transistors, the resistance value between a wiper and a main terminal of a digital potentiometer can only have a finite number of values. As an example, a 16-value digital potentiometer may comprise 15 equal-value resistors connected in series to form a series resistor stack, with the stack being connected between the two main terminals of the potentiometer. A select transistor is then coupled between each internal node of the series-resistor stack and the wiper terminal, and between each main terminal and the wiper terminal, for a total of 16 select transistors. One of the select transistors is set in a conducting state to select one point along the series-resistor stack. As can be seen by this example, the number of resistors and transistors required to implement a digital or solid-state potentiometer increases linearly with the desired number of discrete values. In general, the semiconductor chip area and cost of implementing a digital potentiometer increase, and the number of resistors and transistors increase, as the number of discrete values increases.

Digital potentiometers also have limited accuracy, due to limitations associated with microelectric fabrication technology. For example, some digital potentiometers specify as much as 20% lot to lot variation in resistance values. The step size between steps also varies to a great extent. This results in inaccuracy in the resistance actually achieved.

BRIEF DESCRIPTION OF THE FIGURES

Embodiments of the present invention are illustrated by way of example and not limitation in the Figures of the accompanying drawings in which.

DETAILED DESCRIPTION

Figure 1:
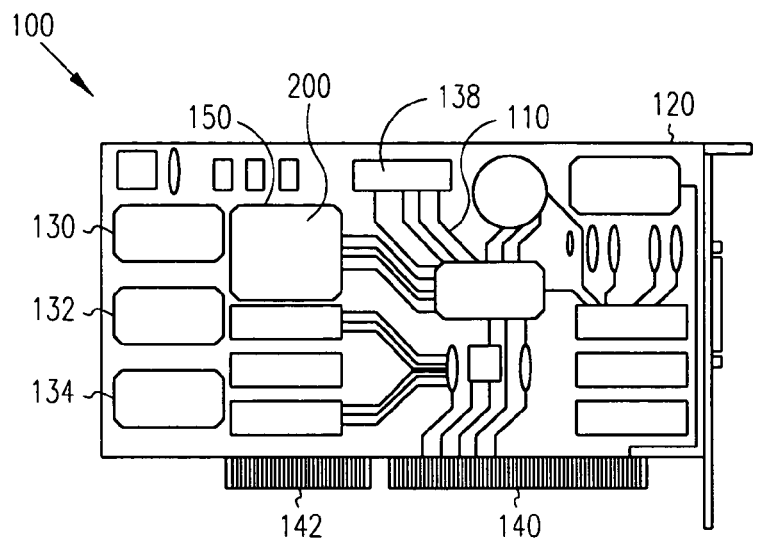
FIG. 1 is a schematic diagram of a printed circuit card that includes a potentiometer network, according to an example embodiment.

Several example embodiments of a system and method for a potentiometer network are described herein. In the following description, numerous specific details are set forth. The following description and the drawing figures illustrate aspects and embodiments of the invention sufficiently to enable those skilled in the art. Other embodiments may incorporate structural, logical, electrical, process, and other changes; e.g., functions described as software may be performed in hardware and vice versa. Examples merely typify possible variations, and are not limiting. Individual components and functions may be optional, and the sequence of operations may vary or run in parallel. Portions and features of some embodiments may be included in, substituted for, and/or added to those of others. The scope of the embodied subject matter encompasses the full ambit of the claims and substantially all available equivalents.

This description of the example embodiments is divided into several sections. In the first section, an embodiment of a system-level overview is presented. In the second section, example implementations and methods for using example implementation embodiments are described. In the third section, an embodiment of a hardware and operating environment is described.

System-Level Overview

This section provides a system level overview of example embodiments of the invention as well as a view of the environment in which an example embodiment is used. FIG. 1 is a top view of a printed circuit board 100, having a component with a potentiometer network 200, according to an example embodiment of the invention. A potentiometer 200 can be used in any circuit where there is need for a resistance that can be varied. FIG. 1 shows one example of such a circuit formed on the printed circuit card 100. The printed circuit board ("PCB") 100 is a multi-layer plastic board that includes patterns of printed circuits on one or more layers of insulated material. The patterns of conductors correspond to wiring of an electronic circuit formed on one or more of the layers of the printed circuit board 100. The printed circuit board 100 also includes electrical traces 110. The electrical traces 110 can be found on an exterior surface 120 of a printed circuit board 100 and also can be found on the various layers within the printed circuit board 100. Printed circuit boards also include through holes (not shown in FIG. 1) which are used to interconnect traces on various layers of the printed circuit board 100. The printed circuit board can also include planes of metallized materials such as ground planes, power planes, or voltage reference planes (not shown in FIG. 1).

The printed circuit board 100 is also populated with various components 130, 132, 134, 136, 138. The components 130, 132, 134, 136, 138 can either be discreet components or semiconductor chips which include thousands of transistors. The components 130, 132, 134, 136, 138 can use any number of technologies to connect to the exterior surface 120 of the circuit board or to the printed circuit board 100. For example, pins may be inserted into plated through holes or pins may be extended through the printed circuit board 100. An alternative technology is surface mount technology where an electrical component, such as component 136, mounts to an array of pads on the exterior surface 120 of the printed circuit board 100. For example, component 136 could be a ball grid array package or device that has an array of balls or bumps that interact or are connected to a corresponding array of pads on the exterior surface 120 of the printed circuit board 100. The printed circuit board 100 can also include connectors 140, 142 for making external connections to other electrical or electronic devices.

The component 136 is a central processing chip or microprocessor. The component 136 includes a semiconductor 200 that includes a potentiometer network according to one or more of the example embodiments discussed below. The potentiometer network of the semiconductor 200 will be further detailed in the following paragraphs. The component 136, in one example embodiment, includes memory resident on the component or resident on the semiconductor that includes the potentiometer network. In other embodiments, one of the components, such as component 132, can also be a memory device. The memory device can a secondary memory for the potentiometer network or can be the primary memory associated with the potentiometer network.

As shown in FIG. 1, the storage device 132 can be positioned near the potentiometer network 200. In some example embodiments, the storage device 132 can be incorporated onto the semiconductor chip of the potentiometer 200. The storage device can be either solid state memory or any other type of memory, such as a disk drive. The storage device 132 can be volatile or nonvolatile. The storage device 110 can be used to store a calibration table (shown in FIG. 6). A calibration table is a table of data needed to calibrate or determine the various amounts of resistance capable of being output from the potentiometer network 200. In some example embodiments, the storage device 132 is also used to store an instruction set that instructs a machine, such as a computer or an information handling device, with respect to making the calibrations associated with the potentiometer network.

Figure 2:
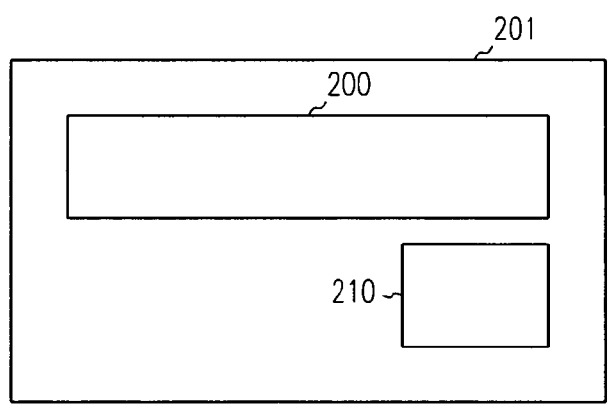
FIG. 2 is a schematic diagram of a printed circuit card that includes a potentiometer network, according to an example embodiment.

FIG. 2 is a schematic drawing of a semiconductor chip 201 that includes a potentiometer network 200, according to an example embodiment. A potentiometer network 200 can be used in any circuit formed on the semiconductor chip 201 where there is need for a resistance that can be varied. As shown in FIG. 2, a storage device 210 can be positioned near the potentiometer network 200. In some example embodiments, the storage device 210 can be incorporated onto the semiconductor chip 201 that includes the potentiometer network 200. The semiconductor chip 201 can also include other circuitry and other components or networks. The storage device 210 can be used to store a calibration table (shown in FIGS. 4, 6 and 8). A calibration table is a table of data needed to calibrate or determine the various amounts of resistance capable of being output from the potentiometer network 200. In some example embodiments, the storage device is also used to store an instruction set that instructs a machine, such as a computer or information handling device, with respect to making the calibrations associated with the potentiometer network.

Figure 3:
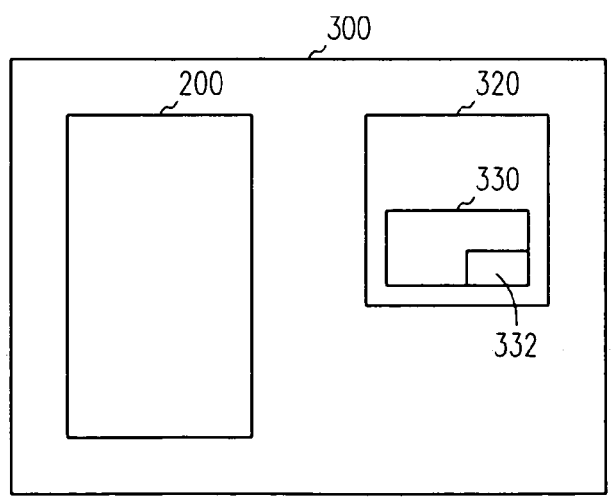
FIG. 3 is a schematic diagram of a system including a resistive network and a calibration module, according to an example embodiment.

FIG. 3 is a schematic diagram of a potentiometer system 300, according to an example embodiment of the invention. The potentiometer system 300 includes a potentiometer network 200 and a calibration module 320 for calibrating the resistance of a potentiometer network, according to an example embodiment. The calibration module includes a storage module 330 that includes a set of instructions 332 that instruct or cause a machine to execute the instructions. There are several methods carried out by the sets of instructions as set forth below in the discussions related to FIGS. 5, 7 and 9. Each of the modules discussed above can be implemented in software, hardware or a combination of both hardware and software. Furthermore, each of the modules can be implemented as an instruction set on a microprocessor associated with a computer system or can be implemented as a set of instructions associated with any form of media, such as a set of instructions on a disk drive, a set of instructions on tape, a set of instructions transmitted over an Internet connection or the like.

Implementations and Methods of Example Embodiments

This section describes methods performed by implementations of example embodiments of the invention. In certain embodiments, the methods are performed by machine-readable media (e.g., software), while in other embodiments, the methods are performed by hardware or other logic (e.g., digital logic). In this section, FIGS. 4-8 will be discussed.

Figure 4:
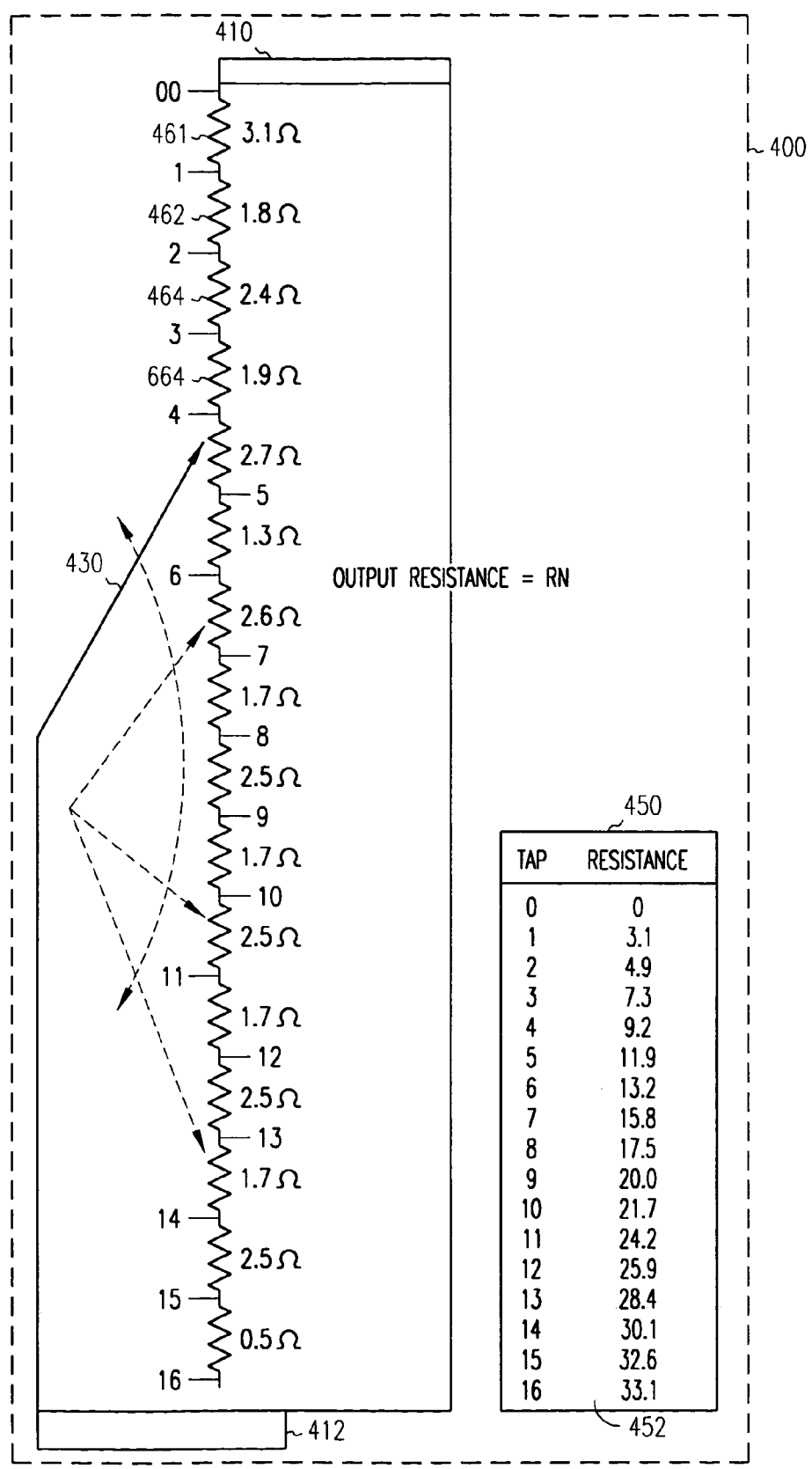
FIG. 4 is a schematic diagram of a resistive network, according to an example embodiment.

FIG. 4 shows a schematic diagram of a potentiometer network 400, according to an example embodiment of the invention. The potentiometer network 400 includes a first main terminal 410, a second main terminal 412, and a wiper apparatus 430. In general applications of potentiometer network 400, a voltage is applied between main terminals 410 and 412 by applying voltages $V_H$ and $V_L$ respectively to these terminals, with an intermediate potential $V_W$ being tapped off by the wiper terminal 430. The potentiometer network 400 also includes a variable resistance network 440 positioned between and coupled to the first terminal 410 and a plurality of resistive elements, such as resistors 461, 462, 463, 464, attached in series. As shown in FIG. 4, there is a single group of sixteen resistive elements connected in series. It should be understood that a resistive network can include any number of resistive elements. A variable resistance value $R_1$ which varies between zero ohms and a value that includes all of the cumulated resistive values of the resistive network 440. In addition, the potentiometer network 400 includes a memory module 450 resident with the resistance network 440.

The memory module 450, as shown in FIG. 4, includes a calibration table 452 that stores the cumulative resistance as a function of a set of tap positions. Each tap position is a tap location between resistive elements attached in series. As shown in FIG. 4, the tap positions on the resistive network are numbered 0 through 16. These tap positions correspond to the tap positions shown in the calibration table. Each tap position (0-16) on the calibration table 452 includes the cumulative resistance of the resistive elements in the variable resistive network 440. The wiping apparatus 430 is used to electrically couple to each of the tap locations (0-16).

Figure 5:
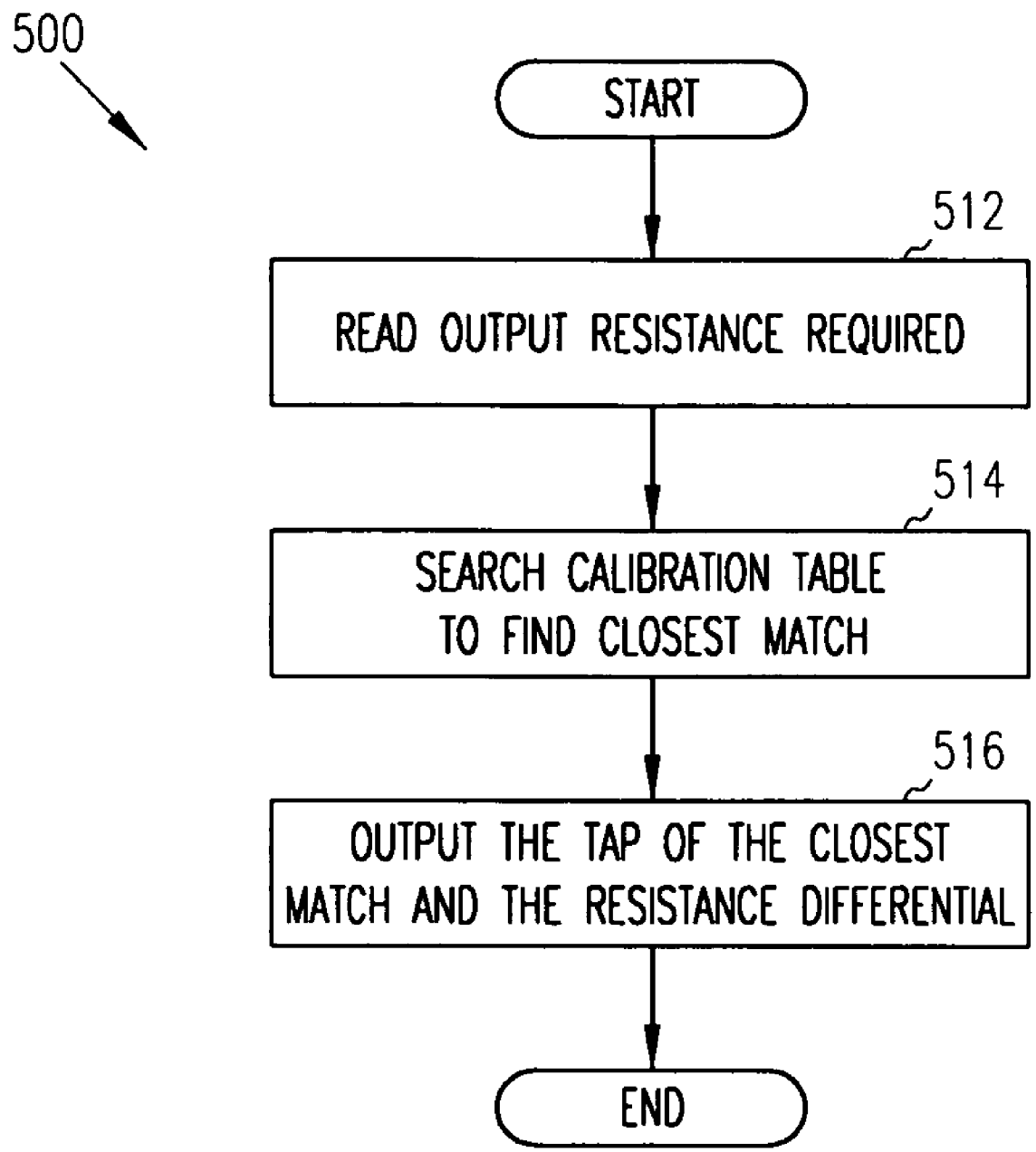
FIG. 5 is a flow diagram illustrating a method for implementing the resistive network of FIG. 3, according to one example embodiment.

FIG. 5 is a flow diagram illustrating a method 500 for implementing the resistive network of FIG. 4, according to one example embodiment. As an overview the flow diagram of the method shows how the wiper position and the error resistance is attained using the calibration data (stored in the calibration table 450 as shown in FIG. 4). The method 500 begins at a start block, depicted by the reference numeral 510. The output resistance required is then read, as depicted by block 512 and, the calibration table is searched to find the closest match, as depicted by reference numeral 514. Of course it should be realized that there may not be an exact match but that a resistance value in the calibration table will be close to the resistance required. The tap point of the closest match and the differential in the resistance is then output, as depicted by reference numeral 516. The method 500 then ends at block 518.

Figure 6:
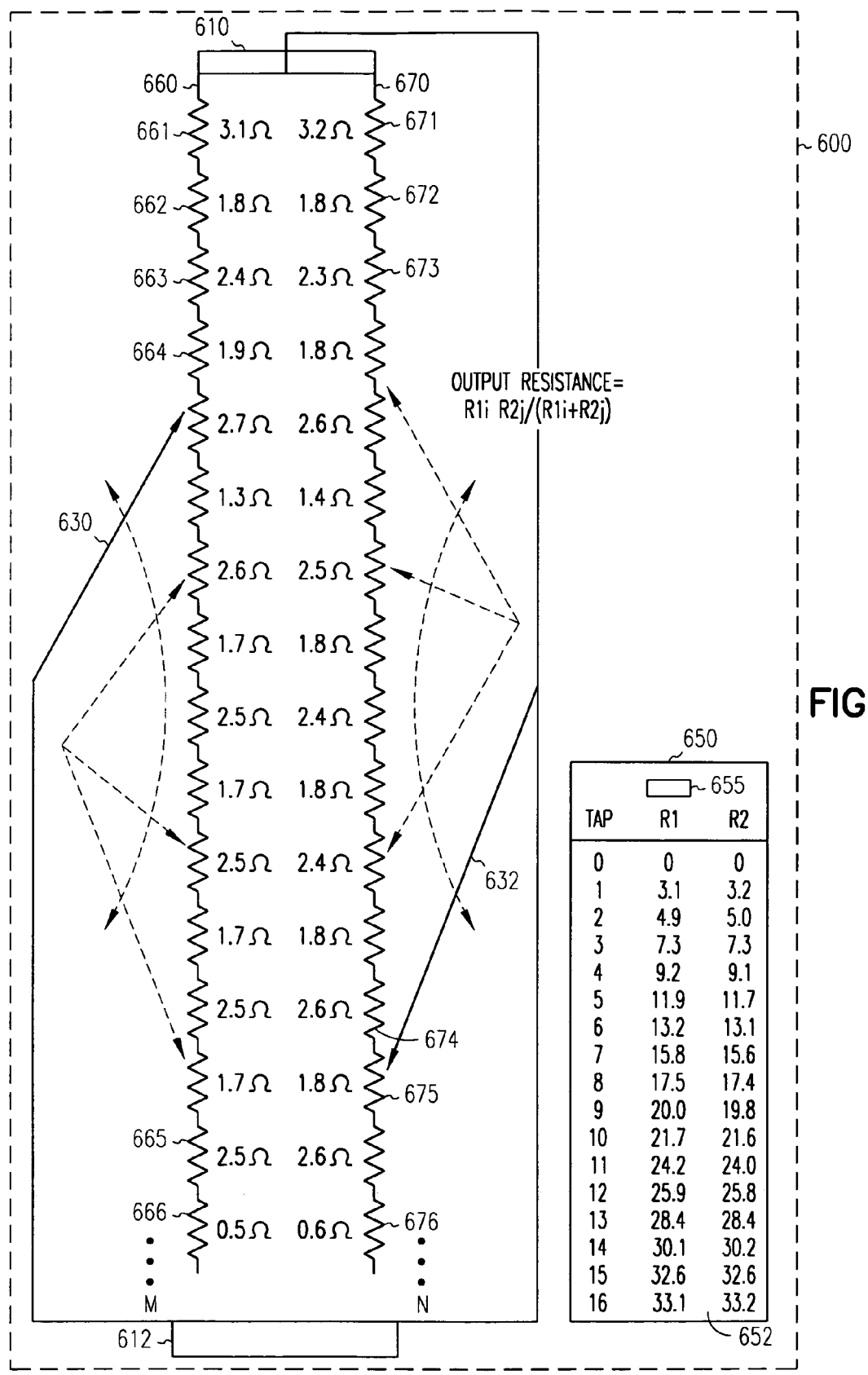
FIG. 6 is a schematic diagram of a resistive network, according to an example embodiment.

FIG. 6 is a schematic diagram of a potentiometer network 600, according to another example embodiment. The potentiometer network 600 includes a first main terminal 610, a second main terminal 612, and a plurality of resistive elements 661, 662, 663, 664, 665, 666, 671, 672, 673, 674, 675 and 676. The resistive elements 661, 662, 663, 664, 665 and 666 are in first group 660 of resistive elements that are connected in series. The resistive elements 671, 672, 673, 674, 675 and 676 are in a second group 670 of resistive elements that are connected in series. The first group of resistive elements 660 is connected in parallel to the second group of resistive elements 670. Both the first group 660 and the second group 670 are connected between the first main terminal 610 and the second main terminal 612. The potentiometer network 600 also includes a device for embedding calibration of said resistive elements in said potentiometer network 600. A first wiping apparatus 630 is associated with the first group 660 of resistive elements. A second wiping apparatus 630 632 is associated with the second group 670 of resistive elements. The first wiping apparatus 630 is movable between various tap positions (0-16) within the first group 660 of resistive elements. The potentiometer network 600, includes a set of taps for accessing points between resistive elements in the first group 660 of resistive elements. Tap 1 of the first group 660 is positioned between resistive element 661 and resistive element 662. Tap 2 of the first group 660 is positioned between resistive element 662 and resistive element 663. As a result, the first group 660 of resistive elements has a first changeable resistance. In other words, the potentiometer includes a first set of taps for accessing points between resistive elements in the first group 660 of resistive elements attached in series. The first set of taps are accessed by the first wiping apparatus 630.

The second wiping apparatus 632 is movable between various tap positions (0-16) within the second group 670 of resistive elements. The potentiometer network 600, includes a set of taps for accessing points between resistive elements in the second group 670 of resistive elements. Tap 1 of the second group 670 is positioned between resistive element 671 and resistive element 672. Tap 2 of the second group 670 is positioned between resistive element 672 and resistive element 673. As a result, the second group 670 of resistive elements has a second changeable resistance. In other words, the potentiometer includes a second set of taps for accessing points between resistive elements in the second group 670 of resistive elements attached in series. The second set of taps are accessed by the second wiping apparatus 632 In some embodiments, the wiping apparatus 630, 632 includes a set of switching elements.

Most of the first set of taps are positioned between at least two of the resistive elements of the first group 660 of resistive elements, and most of the second set of taps are positioned between at least two of the resistive elements of the second group 670 of resistive elements. The first tap point and last tap point in each of the groups of resistive elements are not positioned between two resistive elements. The first tap point, generally represents the resistance other than resistance associated with the resistive elements and the last tap point represents or is the resistance associated with all the resistive elements and the last tap point represents or is the resistance associated with all the resistive elements upstream. The first wiping apparatus 630 couples at least one of the first set of taps between the resistive elements of the first group 660 of resistive elements attached in series. Similarly, the second wiping apparatus 632 couples at least one of the second set of taps between the resistive elements of the second group 670 of resistive elements. The device for embedding calibration of said resistive elements in said potentiometer network 600 further includes a memory module 650, and a set of instructions 655 stored on the memory module 650 for determining the resistance of a first variable resistance, $R_1$ associated with a first group 660 of resistances in parallel with a second variable resistance, $R_2$, associated with a second group 670 of resistances. The result is stored in the memory module 650. The first variable resistance, $R_1$, includes one or more of the resistances in series of the first group of resistances, and the second variable resistance, $R_2$, includes one or more of the resistances in series of the second group 670 of resistances.

Figure 7:
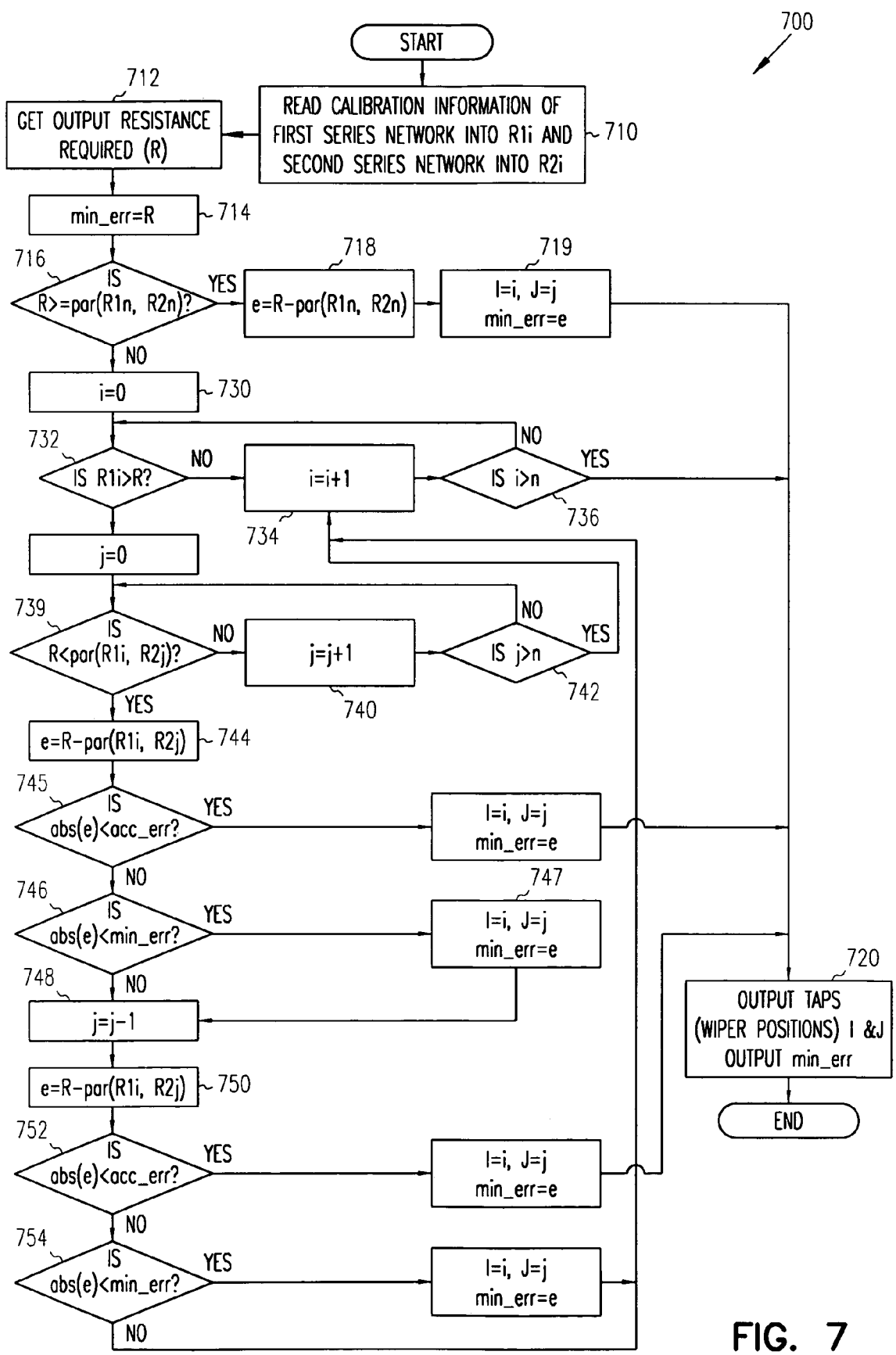
FIG. 7 is a flow diagram illustrating a method for implementing the resistive network of FIG. 6, according to one example embodiment.

FIG. 7 is a flow diagram of a method 700 for implementing the potentiometer network 600 of FIG. 6, according to one example embodiment. As an overview the memory module 650 includes the cumulative resistance for each tap along the first group 660 of resistive elements and for each tap along the second group 670 of resistive elements. The method 700 includes calculating the resistance in parallel between the variable resistance $R_1$ and the variable resistance $R_2$. The various variable resistances are plugged in from the various taps associated with the first group 660 and the second group 670 until the calculated resistance that is within the amount of error also allowed or in the requirement. In other words, the save instruction 655 associated with the memory module 650 calculates the resistance in parallel for various values of the variable resistance $R_1$ associated with the first group 660 and for various values of the resistance $R_2$ associated with the second group 670 of resistive elements. The resistance in parallel is set forth by the equation below in which $R_o$ is the output resistance from the potentiometer network 600 or the various variable resistances $R_1$ and $R_2$.

$$R_o = \frac{R_1 \times R_2}{R_1 + R_2}$$

Now looking at the method 700 initially the calibration information from the calibration table 652 stored within the memory module 650 is read, as depicted by reference numeral 710. The output resistance that is required, R, is also obtained, as depicted by reference numeral 712. In addition, the min_err variable is initialized to R as depicted by reference numeral 714. This variable is used to hold the error between the required resistance R and the resistance that would be achieved. The maximum resistance is then calculated with the maximum cumulative variable resistance $R_1$ and the maximum cumulative variable resistance $R_2$ being placed in parallel and a resistance value is associated with the two placed in parallel being calculated. The output resistance is then compared to the calculated maximum parallel resistance $R_1n$, $R_2n$, as depicted by reference numeral 716. If the resistance required, R, is greater than the calculation of the resistances $R_1n$, $R_2n$ calculated in parallel, then an error amount is determined by subtracting the calculated parallel, resistance of the first group of resistances and the second group of resistances from the required resistance R, as depicted by reference numeral 718. The wiper positions are set at the maximum resistance position where I=i, and J=j (i and j are variables whose value change during calculations. I & J are variables that finally end up holding the results and so these are output). The minimum error is determined to be e, which is the required resistance minus the resistance determined when the variable resistance $R_1$ is at its max and the variable resistance $R_2$ is set at their max. The wiper positions or output taps I and J, as well as the output minimum error are then output to the potentiometer network 600, as depicted by reference numeral 720.

If the resistance is not greater than the maximum resistance, then the wiper position i associated with variable resistance $R_1$ is set to zero as depicted by reference numeral 730 with both of the variable resistance set at tap position zero. The next step is to begin stepping up the resistance for the first wiper position $R_{1i}$. A decision box 732 is then encountered that determines whether $R_{1i}$ is greater than the output resistance required R, as depicted by reference numeral 732. If the $R_{1i}$ is not greater than the output resistance required R, then the wiper position for $R_1$ is moved to the next tap position, as depicted by reference numeral 734 and it is determined whether or not i is greater than n which is the last tap position associated with the variable resistance $R_1$, as depicted by decision tree 736. If i is greater than n then the output taps I, J and the minimum error are output as depicted by reference numeral 720. If not, the step 732 is repeated. If $R_1$ is greater than R, then j, the wiper position associated with the second variable resistor is set to zero, and the parallel resistance for $R_{1i}$, $R_{2j}$ is calculated and compared with the output resistance required as depicted by reference numeral 739. If the output resistance is not less than the calculated resistance of the variable resistance $R_{1i}$, $R_{2j}$ then the wiper position associated with the second group of resistive elements is incremented by one, as depicted by reference numeral 740.

If j is greater than n, as depicted by reference numeral 742, then the wiper position associated with the first variable resistance is incremented as depicted by reference numeral 734. If j is not greater than n, then a new parallel resistance at the new wiper position j for the second variable resistance is calculated as depicted by decision box 739 and the calculated resistance is determined whether the output resistance R is less than the calculated parallel resistance for the potentiometer network. If the output resistance is less than the parallel calculated resistance for the two variable resistance in parallel then e equals R minus the latest calculated resistance for the variable resistance 1 with a wiper position i and the variable resistance 2 with a wiper position j subtracted from required resistance, as depicted by reference numeral 744.

It is then determined whether the absolute value of the error is less than the acceptable error, as depicted by reference numeral 744. If the absolute value of the error is less than the acceptable error, the wiper position i, the wiper position j associated with the second variable resistance, and the minimum error equal to e are then output, as depicted by reference numeral 720. If the absolute value of the error is not less than the acceptable error, then the absolute value of the error is determined whether or not to be less than the minimum error; if it is then the wiper positions are noted as depicted by the reference numeral 747 and the j position is decremented by one wiper position, as depicted by reference numeral 748. The error is then re-calculated given the required output and the new wiper positions for the variable resistances in parallel, as depicted by reference numeral 750. It is then determined whether the absolute error is less than the acceptable error, as depicted by reference numeral 752. If the absolute value of the error is less than the acceptable error, then the wiper positions I, J and the minimum error are equal to e are then output, as depicted by reference numeral 720. If the absolute value of the error is not less than the acceptable error, then it is checked as to whether the absolute error is less than the minimum error, as depicted by reference numeral 754. If it is, then the wiper position i is changed as depicted by reference numeral 734. If not, then the wiper position i is incremented by one, as depicted by reference numeral 734. In short, the wiper positions of the first variable resistance and the second variable resistance, $R_2$, are changed until the calculated resistance of the first variable resistance and the second variable resistance at their current value, produces a resistance which is less than or equal to the acceptable error as well as the output resistance. If this is not achieved, which can happen if the acceptable error is very low, the min_err is more than the acceptable error. The combination that provides lowest min_err is output as depicted in 720.

As discussed above, the wiper positions are changed to various tap points when determining the resultant resistance of the resistance network. In another example embodiment, the resistance can be measured initially for the various tap points at a first set of resistive elements and for the various tap points at a second set of resistive elements. The values measured can then be used to a desired resistance (using the resistance values of the network) and the wiper position is not changed until after the points are computed. Once the wiper positions are determined then the wiper position is changed to present the desired resistance.

Figure 8:
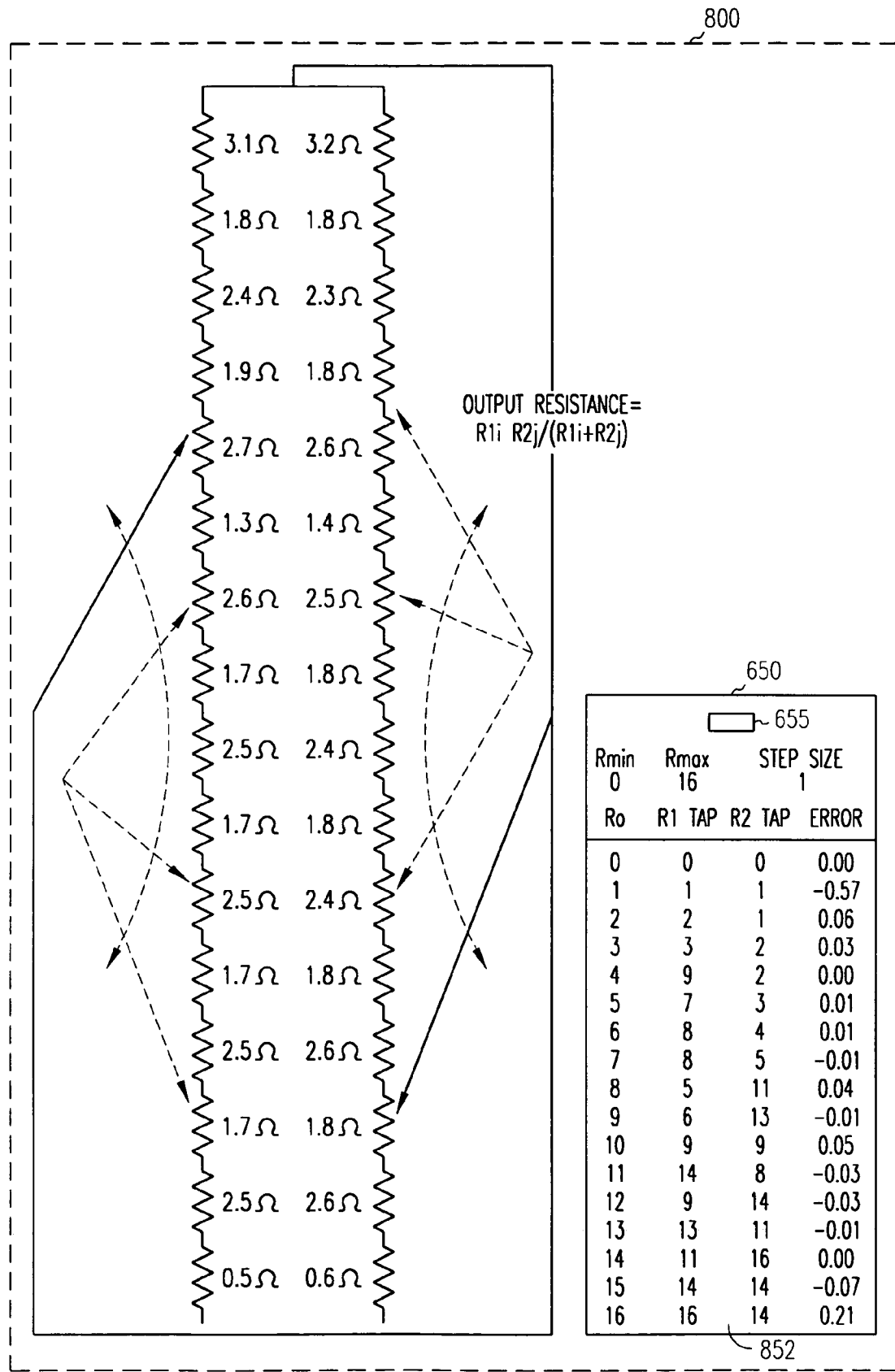
FIG. 8 is a schematic diagram of a resistive network, according to an example embodiment.

FIG. 8 is a schematic diagram of a potentiometer network 800, according to another example embodiment. The potentiometer network 800 includes substantially the same elements as the potentiometer network 600. Therefore, for the sake of brevity and for the sake of clarity, only the differences between the potentiometer network 800 and the potentiometer network 600 will be discussed. The potentiometer network 800 includes a memory module 650 which has a set of instructions 655 stored within the memory module. The data in the calibration table, or what is stored as the calibration table, is depicted by the reference numeral 852. What is stored in the calibration table 852 is the resistance in steps $R_o$, or output resistance for various tap positions in the variable resistance $R_1$ and the variable resistance $R_2$. Also stored in the calibration table is the amount of error in resistance. For example, when $R_o$, the output resistance, is supposed to be 1 ohm, the tap position for the variable resistance $R_1$ is set at the first tap position, and the tap position for the variable resistance $R_2$ is also set at the first tap position. This has been calculated to be 1 ohm with an error of 0.057 ohms. Similarly, for various output resistances, there are various tap positions stored and an associated error. For example, to obtain an output resistance R of 11 ohms, the wiper of the first series network would be at a tap point 14 and the wiper of the second series network would be at a tap point 8. This would result in an output resistance of 10.97 ohms, which is equal to 11 ohms minus 0.03 ohms. In other words, 11 ohms with an error of −0.03 ohms. Thus, in this particular embodiment, the various resistance levels are determined for each of the tap positions or a possible combination of tap positions and then the result is sorted. The end result is that there may be as many as $n^2$ different output resistances. As a result the calibration table could be very large since each of the output resistances, the associated tap resistance for the first series variable resistor are 1, and the tap point or wiper position for the second series resistance is also stored in the calibration table. In this particular application, the amount of data stored in the calibration table can be quite large. In some example embodiments, a header is provided showing the minimum ($R_{min}$) resistance possible, the maximum resistance ($R_{max}$) possible, and the Step Size. Depending on the accuracy desired, different Step Sizes can be provided for. The smaller the Step Size, the greater the accuracy and the greater the amount of memory that is required.

Figure 9:
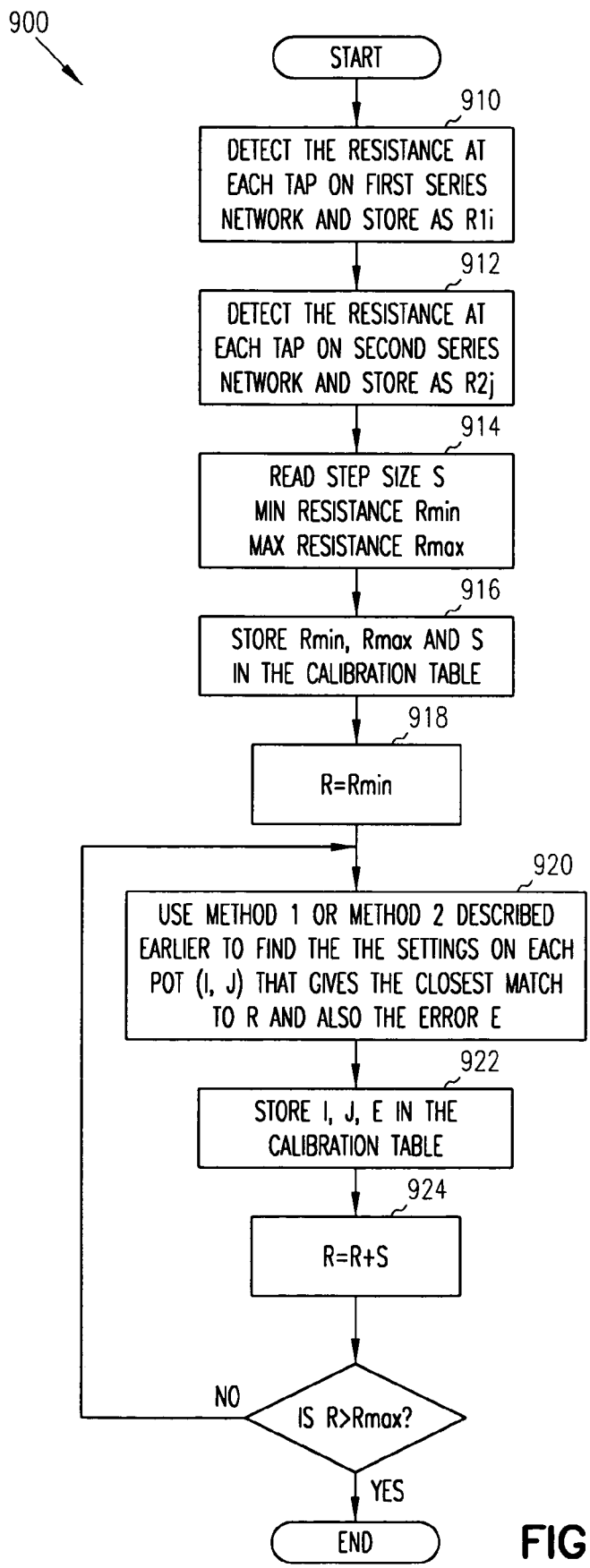
FIG. 9 is a flow diagram illustrating a method for implementing the resistive network of FIG. 8, according to one example embodiment.

FIG. 9 is a flow diagram illustrating another method 900 for implementing the resistive network 800 of FIG. 8, according to another example embodiment. In this particular example embodiment, a step size, S, is defined, and the wiper positions associated with the first series variable resistance and the second series variable resistance are determined. Initially, the resistance at each tap in the first series networks is detected and stored as $R_{1i}$, as depicted by reference numeral 910. Similarly the resistance at each tap on the second series network is detected and stored as $R_{2j}$, as depicted by reference numeral 912. The step size, the minimum resistance $R_{min}$ and the maximum resistance $R_{max}$ are then read, as depicted by reference numeral 914 and stored in the calibration table, as depicted by reference numeral 916. The output resistance is then set to the minimum output resistance as depicted by reference numeral 918. The wiper positions are then moved for on the first series network and on the second series network until the closest match to the output resistance are with a given acceptable error e is found, as depicted by reference numeral 920. The actual wiper positions I, J and the error e are then stored in the calibration table for the related output resistance and the output resistance is then incremented by a minimum step or a step size S, as depicted by reference numeral 924, and the process is repeated starting at reference 920. When the output resistance R is greater than the maximum resistance, then the steps 920, 922 and 924 are repeated. If the output resistance is greater than $R_{max}$, then the process ends. This results in a stored calibration table that includes the output, the tap positions for the first series network, and the tap positions associated with the second series network or the tap positions associated with the variable resistance $R_1$ and the variable resistance $R_2$ are stored on the calibration table so that when an output resistance is required or determined, the calibration table needs only be scanned for the closest output resistance and resultant error for a particular step. The wipers can then move to the taps and the variable resistance, $R_1$ and the variable resistance $R_2$ so as to output that particular output resistance.

Thus this particular method will store more information for the various tap positions and can conceivably store as many as n*n combinations of tap positions. Of course if two combinations of tap positions yields substantially the same result, only one combination of tap positions may be stored.

As discussed above, the wiper positions are changed to various tap points when determining the resultant resistance of the resistance network. In another example embodiment, the resistance can be measured initially for the various tap points at a first set of resistive elements and for the various tap points at a second set of resistive elements. The values measured can then be used to a desired resistance (using the resistance values of the network) and the wiper position is not changed until after the points are computed. Once the wiper positions are determined then the wiper position is changed to present the desired resistance.

In some embodiments, the potentiometer network, the plurality of resistive elements connected in parallel between the first main terminal and the second main terminal includes a first plurality of resistive elements connected in series and having a first set of tap locations, and a second plurality of resistive elements connected in series and having a second set of tap locations. The device for locating tappings further include a memory module, and a set of tap locations stored on the memory module that include a resistance value associated with a tap location from the first plurality of resistive elements, and a tap location from the second plurality of resistive elements. The plurality of resistive elements connected in parallel between the first main terminal and the second main terminal include a first plurality of resistive elements connected in series and having a first set of tap locations, and a second plurality of resistive elements connected in series and having a second set of tap locations. The device for locating tappings further includes a memory module, and a set of instructions stored on the memory module for determining a resistance value associated with a tap location from the first plurality of resistive elements and a tap location from the second plurality of resistive elements.

The methods, such as methods 500, 700, and 900, can be applied to any sized potentiometer system. The memory module can store instructions as well as a calibration table, as depicted by the various methods and example embodiments set forth above.

The method performed in a controller, detailed above, to both perform the calibration or to use the calibration data can either be on the potentiometer or in a computing device or other information handling system coupled to the potentiometer. A controller in the potentiometer, an information handling system, or computing device coupled to the potentiometer can also execute these instructions.

Hardware and Operating Environment

This section provides an overview of the example hardware and the operating environment in which embodiments of the invention can be practiced.

Figure 10:
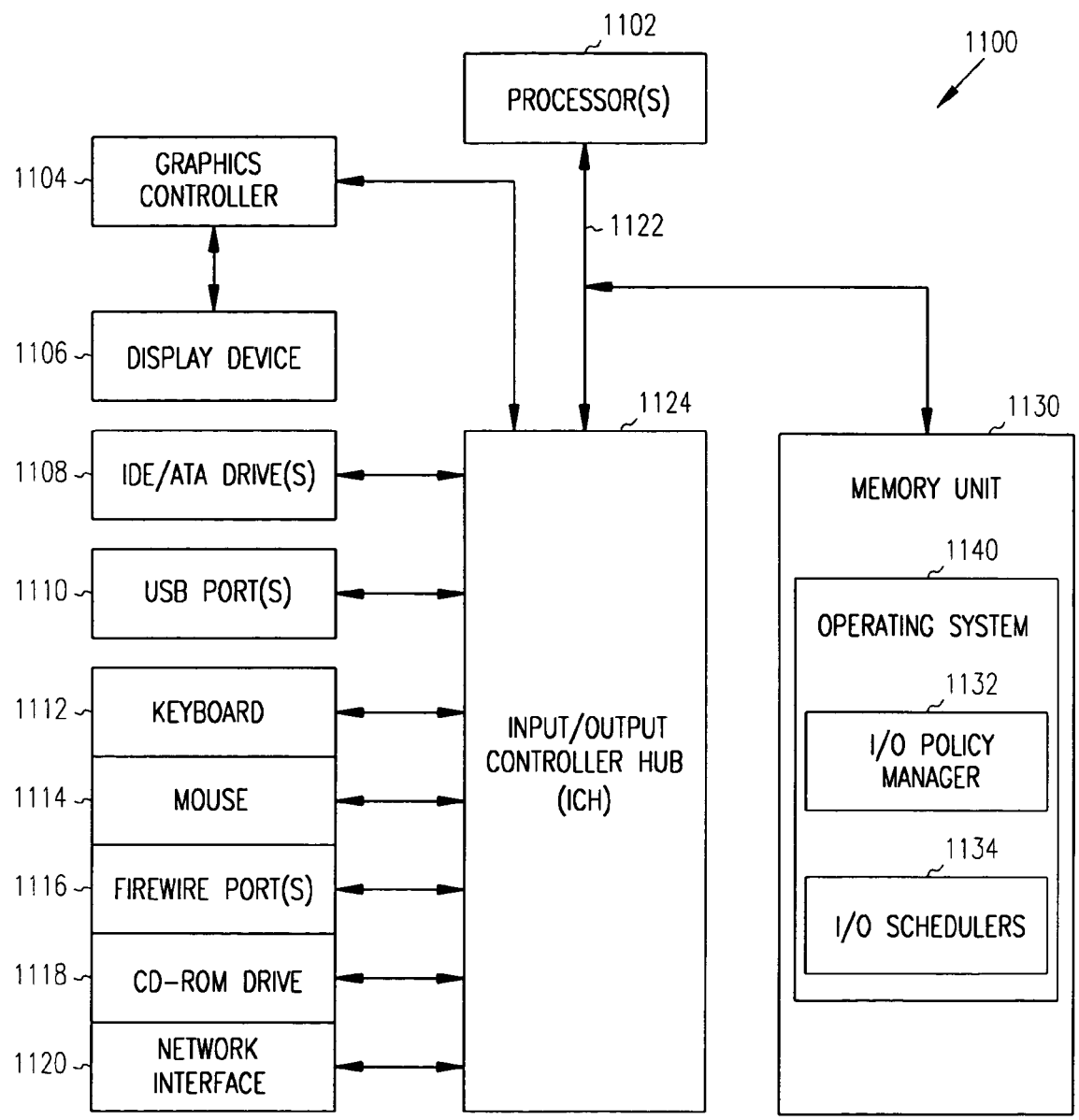
FIG. 10 illustrates an example computer system used in conjunction with certain example embodiments of the invention.

FIG. 10 illustrates an example computer system used in conjunction with certain example embodiments of the invention. As illustrated in FIG. 9, computer system 1100 comprises processor(s) 1102. The computer system 1100 also includes a memory unit 1130, processor bus 1122, and Input/Output controller hub (ICH) 1124. The processor(s) 1102, memory unit 1130, and ICH 1124 are coupled to the processor bus 1122. The processor(s) 1102 may comprise any suitable processor architecture. The computer system 1100 may comprise one, two, three, or more processors, any of which may execute a set of instructions in accordance with embodiments of the present invention.

The memory unit 1130 includes an operating system 1140, which includes an I/O scheduling policy manager 1132 and I/O schedulers 1134. The memory unit 1130 stores data and/or instructions, and may comprise any suitable memory, such as a dynamic random access memory (DRAM), for example. The computer system 1100 also includes IDE drive(s) 1108 and/or other suitable storage devices. A graphics controller 1104 controls the display of information on a display device 1106, according to embodiments of the invention.

The Input/Output controller hub (ICH) 1124 provides an interface to I/O devices or peripheral components for the computer system 1100. The ICH 1124 may comprise any suitable interface controller to provide for any suitable communication link to the processor(s) 1102, memory unit 1130 and/or to any suitable device or component in communication with the ICH 1124. For one embodiment of the invention, the ICH 1124 provides suitable arbitration and buffering for each interface.

For one embodiment of the invention, the ICH 1124 provides an interface to one or more suitable integrated drive electronics (IDE) drives 1108, such as a hard disk drive (HDD) or compact disc read-only memory (CD ROM) drive, or to suitable universal serial bus (USB) devices through one or more USB ports 1110. For one embodiment, the ICH 1124 also provides an interface to a keyboard 1112, a mouse 1114, a CD-ROM drive 1118, and one or more suitable devices through one or more firewire ports 1116. The ICH 1124 also provides a network interface 1120 though which the computer system 1100 can communicate with other computers and/or devices.

In one embodiment, the computer system 1100 includes a machine-readable medium that stores a set of instructions (e.g., software) embodying any one, or all, of the methodologies for dynamically loading object modules described herein. Furthermore, software can reside, completely or at least partially, within memory unit 1130 and/or within the processor(s) 1102.

Thus, a system, method, and machine-readable medium including instructions for Input/Output scheduling have been described. Although the present invention has been described with reference to specific example embodiments, it will be evident that various modifications and changes may be made to these embodiments without departing from the broader spirit and scope of the disclosed subject matter. Accordingly, the specification and drawings are to be regarded in an illustrative rather than a restrictive sense.

The invention claimed is:

1. A potentiometer network comprising:
    a first main terminal;
    a second main terminal;
    a plurality of resistive elements connected in parallel between the first main terminal and the second main terminal, wherein the plurality of resistive elements comprises:
        a first group of resistive elements including a plurality of resistive elements attached in series; and
        a second group of resistive elements including a plurality of resistive elements attached in series, the first group of resistive elements attached in parallel to the second group of resistive elements;
    means for embedding calibration of said resistive elements in said potentiometer network;
    a first set of taps for accessing points between resistive elements in the first group of resistive elements attached in series; and
    a second set of taps for accessing points between resistive elements in the second group of resistive elements attached in series.

2. The potentiometer network of claim 1 wherein the plurality of resistive elements further comprises;
    a first group of resistive elements; and
    a second group of resistive elements, the first group of resistive elements attached in parallel to the second group of resistive elements, and wherein one of the first group and the second group includes a plurality of resistive elements attached in series.

3. The potentiometer network of claim 2 wherein the first group of resistive elements has a first changeable resistance and wherein the second group of resistive elements has a second changeable resistance.

4. The potentiometer network of claim 2 further comprising a set of taps for accessing points between resistive elements in the one of the first group an the second group that includes a plurality of resistive elements attached in series.

5. The potentiometer network of claim 4 further comprising a wiping apparatus for coupling the at least one of the set of taps between the resistive elements on one of the first group and the second group that include a plurality of resistive elements attached in series.

6. The potentiometer network of claim 5 wherein the wiping apparatus further comprises a set of switching elements.

7. The potentiometer network of claim 1 further comprising means for locating tappings between said first main terminal and second main terminal based on a set of calibration values output from the plurality of resistive elements connected in parallel between the first main terminal and the second main terminal.

8. The potentiometer network of claim 7 wherein the plurality of resistor elements include at least one resistor element having a minimum resistive magnitude.

9. The potentiometer network of claim 8, wherein the absolute difference between the desired resistance and the resultant resistance achieved is less than about 20 percent of the minimum resistive magnitude.

10. The potentiometer network of claim 8, wherein the average of the absolute difference between the desired resistance and the resultant resistance achieved is less than about 5 percent of the minimum resistive magnitude.

11. A potentiometer network comprising:
    a first main terminal;
    a second main terminal;
    a plurality of resistive elements connected in parallel between the first main terminal and the second main terminal, wherein the plurality of resistive elements comprises:
        a first group of resistive elements including a plurality of resistive elements attached in series; and
        a second group of resistive elements including a plurality of resistive elements attached in series, the first group of resistive elements attached in parallel to the second group of resistive elements;
    means for embedding calibration of said resistive elements in said potentiometer network;
    a first set of taps for accessing points between resistive elements in the first group of resistive elements attached in series;
    a second set of taps for accessing points between resistive elements in the second group of resistive elements attached in series;

a first set of taps associated with the resistive elements of the first group of resistive elements;

a first wiping apparatus for coupling to at least one of the first set of taps between the resistive elements of the first group of a plurality of resistive elements attached in series;

a second set of taps associated with the resistive elements of the second group of resistive elements; and a second wiping apparatus for coupling to at least one of the second set of taps between the resistive elements of the second group of a plurality of resistive elements attached in series.

12. A potentiometer network comprising:

a first main terminal;

a second main terminal;

a plurality of resistive elements connected in parallel between the first main terminal and the second main terminal, wherein the plurality of resistive elements comprises:

a first group of resistive elements including a plurality of resistive elements attached in series; and a second group of resistive elements including a plurality of resistive elements attached in series, the first group of resistive elements attached in parallel to the second group of resistive elements;

a first set of taps for accessing points between resistive elements in the first group of resistive elements attached in series; and a second set of taps for accessing points between resistive elements in the second group of resistive elements attached in series.

13. A potentiometer network comprising:

a first main terminal;

a second main terminal;

a plurality of resistive elements connected in parallel between the first main terminal and the second main terminal, wherein the plurality of resistive elements comprises:

a first group of resistive elements including a plurality of resistive elements attached in series; and a second group of resistive elements including a plurality of resistive elements attached in series, the first group of resistive elements attached in parallel to the second group of resistive elements;

a first set of taps for accessing points between resistive elements in the first group of resistive elements attached in series;

a second set of taps for accessing points between resistive elements in the second group of resistive elements attached in series;

a first set of taps associated with the resistive elements of the first group of resistive elements;

a first wiping apparatus for coupling to at least one of the first set of taps between the resistive elements of the first group of a plurality of resistive elements attached in series;

a second set of taps associated with the resistive elements of the second group of resistive elements; and a second wiping apparatus for coupling to at least one of the second set of taps between the resistive elements of the second group of a plurality of resistive elements attached in series.

\* \* \* \* \*